(12) United States Patent
Kaneko et al.

(10) Patent No.: US 7,870,751 B2
(45) Date of Patent: Jan. 18, 2011

(54) TEMPERATURE CONTROL SYSTEM AND SUBSTRATE PROCESSING APPARATUS

(75) Inventors: Kengo Kaneko, Nirasaki (JP); Toshihiro Hayami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 610 days.

(21) Appl. No.: 11/370,858

(22) Filed: Mar. 9, 2006

(65) Prior Publication Data

US 2006/0201172 A1    Sep. 14, 2006

Related U.S. Application Data

(60) Provisional application No. 60/664,960, filed on Mar. 25, 2005.

(30) Foreign Application Priority Data

Mar. 11, 2005  (JP) .............................. 2005-068975

(51) Int. Cl.
   *F25D 17/00* (2006.01)
(52) U.S. Cl. .......................... 62/180; 62/185; 62/259.2; 62/434; 361/699
(58) Field of Classification Search ............... 62/185, 62/259.2, 180, 434; 361/699
   See application file for complete search history.

(56) References Cited

U.S. PATENT DOCUMENTS

| | | | | |
|---|---|---|---|---|
| 4,931,135 | A * | 6/1990 | Horiuchi et al. ................. | 216/67 |
| 5,579,826 | A * | 12/1996 | Hamilton et al. ............ | 165/254 |
| 6,026,896 | A * | 2/2000 | Hunter ........................ | 165/206 |
| 6,148,145 | A | 11/2000 | Kadotani | |
| 6,269,871 | B1 * | 8/2001 | Nishio et al. ................. | 165/173 |
| 6,757,169 | B2 * | 6/2004 | Kondo et al. ................. | 361/699 |
| 6,993,919 | B2 * | 2/2006 | Hirooka et al. ............... | 62/115 |
| 7,216,496 | B2 * | 5/2007 | Yamazaki .................... | 62/185 |
| 2001/0003067 | A1 * | 6/2001 | Kamikawa et al. .......... | 438/758 |

(Continued)

FOREIGN PATENT DOCUMENTS

JP         06-117722         4/1994

(Continued)

OTHER PUBLICATIONS

Office Action issued Jul. 27, 2010, in Japan Patent Office No. 2005-068975, filed Jul. 15, 2010 (with English-language translation).

*Primary Examiner*—Cheryl J Tyler
*Assistant Examiner*—Jonathan Koagel
(74) *Attorney, Agent, or Firm*—Oblon, Spivak, McClelland, Maier & Neustadt, L.L.P.

(57) ABSTRACT

A temperature control system and a substrate processing apparatus are provided. The temperature control system for controlling temperatures of one or more members of a substrate processing apparatus includes a circulation system for circulating a first coolant to pass through the inside of each of the members, a heat exchanger for performing heat exchange between the first coolant of the circulation system and a second coolant, and a chiller for supplying the second coolant to the heat exchanger, wherein the circulation system includes a branch line for each of the members passing through the inside thereof, the branch line for each of the members is provided with a heating member for heating the first coolant supplied thereto, and the heat exchanger is installed in a room where the substrate processing apparatus is installed.

9 Claims, 6 Drawing Sheets

U.S. PATENT DOCUMENTS

2004/0068997 A1 * 4/2004 Hirooka et al. ............... 62/175
2004/0216475 A1 * 11/2004 Sasaki et al. .................. 62/185

FOREIGN PATENT DOCUMENTS

| JP | 9-280756 | 10/1997 |
| JP | 11-302850 | 11/1999 |
| JP | 2004-040052 | 2/2004 |
| WO | WO 2005007928 A1 * | 1/2005 |

* cited by examiner

TEMPERATURE CONTROL SYSTEM AND SUBSTRATE PROCESSING APPARATUS

FIELD OF THE INVENTION

The present invention relates to a temperature control system for controlling temperatures of one or more members, and a substrate processing apparatus.

BACKGROUND OF THE INVENTION

For example, in a manufacturing of a semiconductor device, e.g., an etching process or a film forming process is performed by using a plasma.

A plasma processing using the plasma, is usually performed by a plasma processing apparatus installed in a clean room. A parallel plate type plasma processing apparatus including an upper and a lower electrode is widely used. The plasma processing apparatus includes, for example, in a processing vessel, the upper electrode to which a high frequency power for generating the plasma is applied, a lower electrode on which a substrate is mounted, and the like. And, by reducing a pressure in the processing vessel to a predetermined pressure, supplying a processing gas into the processing vessel, and then applying the high frequency power for generating the plasma to the upper electrode, the plasma is generated in the processing vessel, and is employed to etch a film on the substrate.

The plasma processing is performed under a high temperature condition to generate the plasma. However, it required to maintain a temperature in the processing vessel or a substrate temperature at a constant value in order to make a processing state of the substrate stable. On this account, a chiller unit for circulating and supplying a coolant is normally connected to, for example, the lower electrode or the upper electrode of the plasma processing apparatus to remove an accumulated heat in the electrode.

In general, the chiller unit is installed under a floor of the clean room in which the plasma processing apparatus is installed. The electrode is cooled by supplying a coolant thereto through a circulation path extending from the chiller unit to the plasma processing apparatus (see, for example, Japanese Patent Laid-open Application No. 2001-332463). Further, the chiller unit is separately installed for each electrode because a control temperature of the upper electrode is different from that of the lower electrode.

However, in case a distance from the plasma processing apparatus to the chiller unit is long as usual, a coolant storage tank is required in the chiller unit to supply the coolant to the electrode after a coolant temperature is stabilized. This makes a size of the chiller unit large. Further, the large-sized chiller unit is individually installed for each of the upper and the lower electrode, and thus, a large space is required for installing the separate chiller units. In recent, it is also required to control temperatures of members other than the upper and the lower electrode to control the processing state of the substrate more strictly. Therefore, a larger space is further required in case of installing the chiller unit for each of the members.

Besides, because there is a need to store the coolant in the storage tank, the amount of the coolant used is increased accordingly, and thereby a cost of the coolant is increased.

SUMMARY OF THE INVENTION

The present invention has been contrived in consideration of the above circumstances, and therefore, an object thereof is to provide a temperature control system for controlling temperatures of one or more members, such as electrodes, for used in a substrate processing apparatus such as a plasma processing apparatus or the like capable of reducing an installation space and the amount of the coolant used.

In order to achieve the object described above, in accordance with an aspect of the present invention, there is provided a temperature control system for controlling temperatures of one or more members of a substrate processing apparatus including: a circulation system for circulating a first coolant to pass through the inside of each of the members; a heat exchanger for performing heat exchange between the first coolant of the circulation system and a second coolant; and a chiller for supplying the second coolant to the heat exchanger, wherein the circulation system includes a branch line for each of the members passing through the inside thereof, the branch line for each of the members is provided with a heating member for heating the first coolant supplied thereto, and the heat exchanger is installed in a room where the substrate processing apparatus is installed.

In accordance with the present invention, the heat exchanger of the first coolant is installed in the same room where the substrate processing apparatus is installed. Further, the circulation system of the first coolant includes the branch line, formed for each of the members and leading to one or more members, and the branch line for each of the members is provided with the heating member for controlling a temperature of the first coolant. Accordingly, because the first coolant having a predetermined temperature can be supplied as usual to each of the members without a storage tank, the space for the temperature control system can be saved. Further, although the number of members is increased, it is not required to increase the installation space for the chiller because a single chiller is enough to control temperatures of one or more members. Further, the amount of the first coolant used can be substantially reduced because the storage tank is not required, and the heat exchanger is installed in the same room where the substrate processing apparatus is installed. Further, the room may be a clean room.

A flow rate control valve may be installed at the branch line. The circulation system may be devoid of a storage tank of the first coolant.

The temperature control system may further include a first coolant collection device for collecting therein the first coolant of the circulation system and returning the collected first coolant to the circulation system, wherein the first coolant collection device may be detachable from the circulation system.

The first coolant collection device may include: a storage tank for storing the first coolant; a first passageway for introducing the first coolant of the circulation system to the storage tank; a second passageway for draining the first coolant from the storage tank to the circulation system; and a gas supply line for supplying a gas into the second passageway.

The storage tank may be accommodated in an airtight storage tank accommodating container, and the gas supply line may be configured to supply the gas into the storage tank accommodating container.

The substrate processing apparatus may include one or more additional members, and the temperature control system may further include: an additional circulation system for circulating a coolant medium to pass through the inside of each of the additional members; and an additional heat exchanger for performing heat exchange between the coolant medium and a third coolant which serves to cool the second coolant at the chiller.

The first coolant and the coolant medium of the circulation systems may be made of an identical material.

In accordance with another aspect of the present invention, there is provided a substrate processing apparatus including the members of the temperature control system.

In accordance with the present invention, it is possible to reduce the temperature control system in size, to thereby reduce the installation space therefor. Further, the amount of the coolant used and a cost are reduced accordingly.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
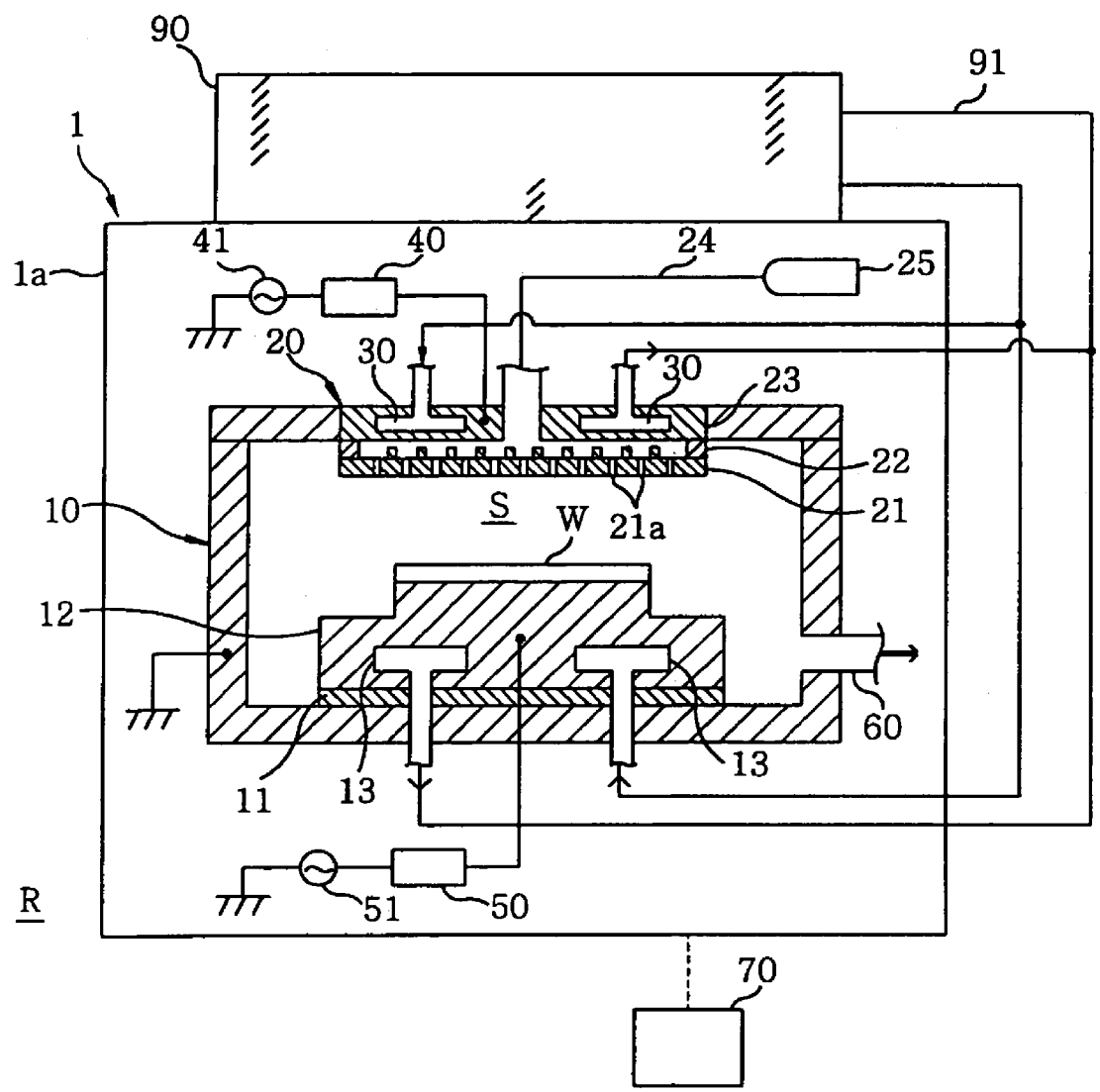
FIG. 1 offers a schematic longitudinal sectional view showing a configuration of a plasma processing apparatus in accordance with a preferred embodiment of the present invention.

Hereinafter, preferred embodiments of the present invention will be described. FIG. 1 is a schematic longitudinal sectional view showing a configuration of a plasma processing apparatus 1 serving as a substrate processing apparatus having a temperature control system in accordance with a preferred embodiment of the present invention applied thereto.

The plasma processing apparatus 1 is installed in a clean room R. The plasma processing apparatus 1 is, for example, a capacitively coupled plasma etching apparatus having a parallel plate type electrode scheme. The plasma processing apparatus 1 is installed, for example, in a housing 1a. The plasma processing apparatus 1 includes, for example, a substantially cylindrical processing vessel 10, and a processing space S is formed in the processing vessel 10. The processing vessel 10 is made of, for example, an aluminum alloy, and an inner wall surface thereof is covered with an alumina film or an yttrium oxide film. The processing vessel 10 is grounded.

A susceptor 12 is provided on a central bottom portion inside the processing vessel 10, with an insulating plate 11 interposed therebetween. The susceptor 12 has a substantially cylindrical shape on which a substrate W can be mounted. The susceptor 12 is made of, for example, an aluminum alloy, and constitutes a lower electrode of the parallel plate type electrode scheme.

An annular flow path 13 is formed in the susceptor 12. The flow path 13, which constitutes a part of a circulation system 91 to be described later, communicates with a heat exchanger 100. A brine as a first coolant is supplied to the flow path 13 and circulated through the circulation system 91, which enables to control a temperature of the substrate W on the susceptor 12.

An upper electrode 20 facing the susceptor 12 is installed above the susceptor 12 to generate a plasma. A plasma generating space is formed between the susceptor 12 and the upper electrode 20.

The upper electrode 20 has a three-layered structure including, for example, an electrode plate 21, a dispersion plate 22 and a top plate 23 in order. A processing gas supply line 24 is connected to, for example, a central portion of the uppermost top plate 23 to introduce an etching gas as a processing gas into the processing space S. The supply line 24 is connected to a processing gas supply source 25. The dispersion plate 22 having, for example, a substantially cylindrical shape is arranged underneath the top plate 23, so that the processing gas introduced through the processing gas supply line 24 can be uniformly dispersed. Underneath the dispersion plate 22, for example, the electrode plate 21 facing the substrate W on the susceptor 12 is provided. Formed on the electrode plate 21 is a plurality of gas injection, openings 21a, through which the processing gas dispersed by the dispersion plate 22 can be uniformly jetted.

An annular flow path 30 through which the brine passes is formed in, e.g., the top plate 23 of the upper electrode 20. The flow path 30, which constitutes a part of the circulation system 91 to be described later, communicates with the heat exchanger 100. The brine is supplied to the flow path 30 and then is circulated through the circulation system 91, which enables to control a temperature of the upper electrode 20.

A first high frequency power supply 41 is electrically connected to the upper electrode 20 via a matching unit 40. The first high frequency power supply 41 is capable of producing a high frequency power having a frequency of, for example, 60 MHz greater than, for example, about 40 MHz. The high frequency power is supplied to the upper electrode 20 by the first high frequency power supply 41, to thereby generate the plasma in the processing space S.

A second high frequency power supply 51 is electrically connected to the susceptor 12 via a matching unit 50. The second high frequency power supply 51 is capable of producing a high frequency power having a frequency of, for example, 20 MHz in a range of, for example, 2 MHz to 20 MHz. The high frequency power is supplied to the susceptor 12 by the second high frequency power supply 51, to thereby induce the charged particles in the processing space S to be brought into the side of the substrate W.

A gas exhaust pipe 60 communicated with a gas exhaust unit (not shown) is connected to a side surface of the processing vessel 10. By exhausting a gas from the gas exhaust pipe 60, it is possible to reduce a pressure in the processing vessel 10 to a desired level.

The plasma processing apparatus 1 is provided with a device control unit 70 which controls operations of various components, for example, the processing gas supply source 25, the first high frequency power supply 41, the second high frequency power supply 51 and the like, all of which perform an etching process. Further, the device control unit 70 can also control operations of a heater and a flow rate control valve of a brine circulation system 91 as will be described later.

In a plasma etching process performed by the plasma processing apparatus 1, first of all, the substrate W is adsorptively supported on the susceptor 12. The temperature of the substrate W supported on the susceptor 12 is controlled to a predetermined temperature of the susceptor 12. Next, a pressure in the processing space S is reduced to a predetermined level by exhausting a gas from, for example, the gas exhaust pipe 60. The processing gas is then supplied into the processing space S through the upper electrode 20. The high frequency power is supplied to the upper electrode 20 by the first high frequency power supply 41, and thus, the processing gas in the processing space S is turned into the plasma. Further, the high frequency power is supplied to the susceptor 12 by the second high frequency power supply 51, and thus, the charged particles of the plasma are induced toward the substrate W. As a result, a film on the substrate W is etched by an action of the plasma.

Figure 2:
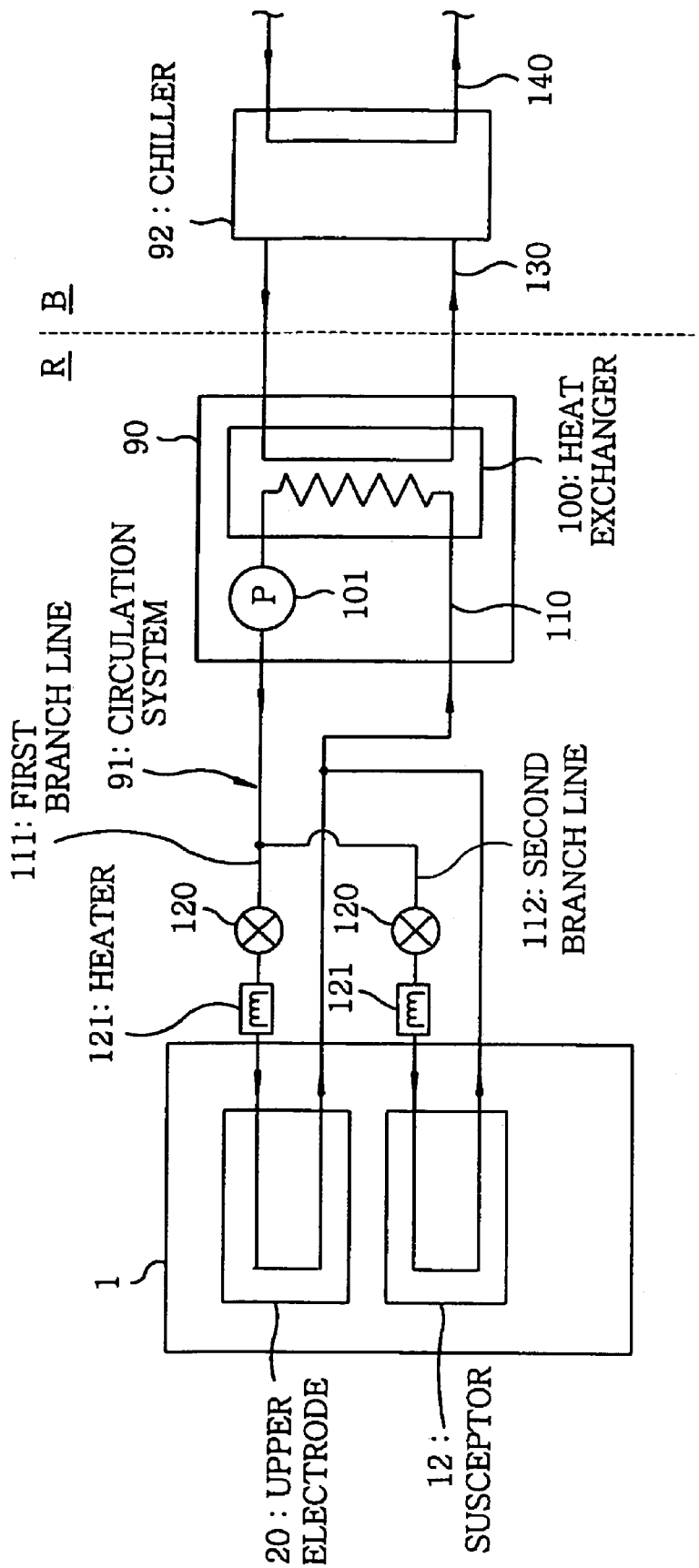
FIG. 2 shows a schematic diagram showing a configuration of a temperature control system.

Hereinafter, a description will be made on the temperature control system 80 for performing a temperature control of the upper electrode 20 and the susceptor 12 of the above-described plasma processing apparatus 1. FIG. 2 is a schematic diagram showing a configuration of the temperature control system 80.

The temperature control system 80, for example, includes: a heat exchange unit 90; the circulation system 91 for circulating the brine as the first coolant between the heat exchange unit 90, and the upper electrode 20 and the susceptor 12; and a chiller 92 for supplying a flon substitute as a second coolant to the heat exchange unit 90.

The heat exchange unit 90 is installed, for example, on the housing 1a of the plasma processing apparatus 1 in the clean room R as shown in FIG. 1. The heat exchange unit 90 includes, for example, the heat exchanger 100 and a pump 101 as shown in FIG. 2. The heat exchanger 100 is capable of cooling the brine in the circulation system 91 by an evaporation action of the flon substitute supplied from the chiller 92. The pump 101 is placed, for example, at an outlet side of the heat exchanger 100, so that the brine in the circulation system 91 can be circulated.

The circulation system 91 includes, for example, a passageway 110 passing through an inside of the heat exchange unit 90, and branch lines 111 and 112 branched off into two ways from the passageway 110. The first branch line 111, for example, communicating with the upper electrode 20 from the passageway 110 on an outlet side of the heat exchanger 100, passes through the flow path 30 in the upper electrode 20, and then, continued to the passageway 110 on an inlet side of the heat exchanger 100. The second branch line 112 communicating with the susceptor 12 from the passageway 110 on the outlet side of the heat exchanger 100, passes through the flow path 13 in the susceptor 12, and then, continued to the passageway 110 on the inlet side of the heat exchanger 100. By help of the circulation system 91, the brine cooled in the heat exchanger 100 can be branched, supplied to the upper electrode 20 and the susceptor 12, respectively, and then, returned back to the same heat exchanger 100.

The flow rate control valve 120 and the heater 121 are provided on an inlet side of the upper electrode 20 of the first branch line 111, that is, on an upstream of the upper electrode 20. Similarly, the flow rate control valve 120 and the heater 121 are provided on an inlet side of the susceptor 12 of the second branch line 112. Accordingly, it is possible to control a flow rate and a temperature of the brine supplied to each of the branch lines 111 and 112 through the passageway 110 to predetermined levels and, to supply the controlled brines to the electrodes 20 and 12, respectively. Therefore, the temperature of the upper electrode 20 can be controlled differently from that of the susceptor 12.

The chiller 92 is installed outside the clean room R, for example, in the service room B located in a basement thereof. Connected to the chiller 92 is a second coolant circulation path 130 for supplying the flon substitute cooled by the chiller 92 to the heat exchanger 100, and returning the flon substitute heat-exchanged by the heat exchanger 100 back to the chiller 92. Further, connected to the chiller 92 is a third coolant circulation path 140 for circulating a cooling water as a third coolant which cools the flon substitute.

Hereinafter, an operation of the temperature control system 80 configured as above is described. Firstly, the brine in the circulation system 91 is pressurized and circulated by the pump 101. The brine is then cooled in the heat exchanger 100 by the flon substitute supplied from the chiller 92. The brine is cooled in the heat exchanger 100 to a temperature below target control temperatures of the upper electrode 20 and the susceptor 12. The flow of the brine cooled in the heat exchanger 100 is branched from the passageway 110 of the circulation system 91 to the respective branch lines 111 and 112. At that time, a branched ratio of flow rates is controlled by settings on the flow rate control valves 120 of the respective branch lines 111 and 112, for example, based on the target control temperatures of the upper electrode 20 and the susceptor 12.

The brine flowing into the first branch line 111 is heated by the heater 121, and controlled to a predetermined target control temperature. The brine which has been temperature controlled in the first branch line 111 is supplied to into the upper electrode 20, and functions to control the temperature of the upper electrode 20. Thereafter, the brine is returned to the passageway 110 from the first branch line 111, and in turn, returned back to the heat exchanger 100. Further, the brine flowing into the second branch line 112 is controlled to a predetermined target control temperature by the heater 121, and supplied into the susceptor 12. The brine in the second branch line 112 functions to control the temperature of the susceptor 12, and, thereafter, it is returned to the passageway 110, and in turn, returned back to the heat exchanger 100. The brine returned to the heat exchanger 100 is cooled again by the flon substitute to be supplied to the upper electrode 20 or the susceptor 12 again.

In accordance with the present preferred embodiment described above, the heat exchanger 100 for the brine is installed in the clean room R, and the circulation system 91 of the brine is formed between the heat exchanger 100 and the upper electrode 20 or the susceptor 12, and thus each of the branch lines 111 and 112 is provided with the heater 121. Accordingly, it is possible to bifurcate the brine from the heat exchanger 100, into two branch lines to thereby independently control each branched brine stream to a desired temperature and supply the independently temperature controlled streams to the upper electrode 20 and the susceptor 12, respectively. According to the above configuration, a conventional storage tank is not required in the service room B and a circulation path of the brine becomes short. Therefore, the amount of the brine used can be substantially reduced. Moreover, because the brine in the heat exchanger 100 is cooled by a single chiller 92, and supplied from the heat exchanger 100 to one or more members, there is no need to be provided with the chiller for each of the members whose temperatures is controlled as in the prior art. Therefore, the temperature control system 80 is reduced in size, and thus, the footprint thereof for an installation thereof can also be reduced.

In the temperature control system 80 described above in accordance with the preferred embodiment, a brine collection device 150 may be installed on the circulation system 91 as a first coolant collection device. The brine collection device 150 will be used to collect the brine in the circulation system 91 to return the collected brine to the circulation system 91.

Figure 3:
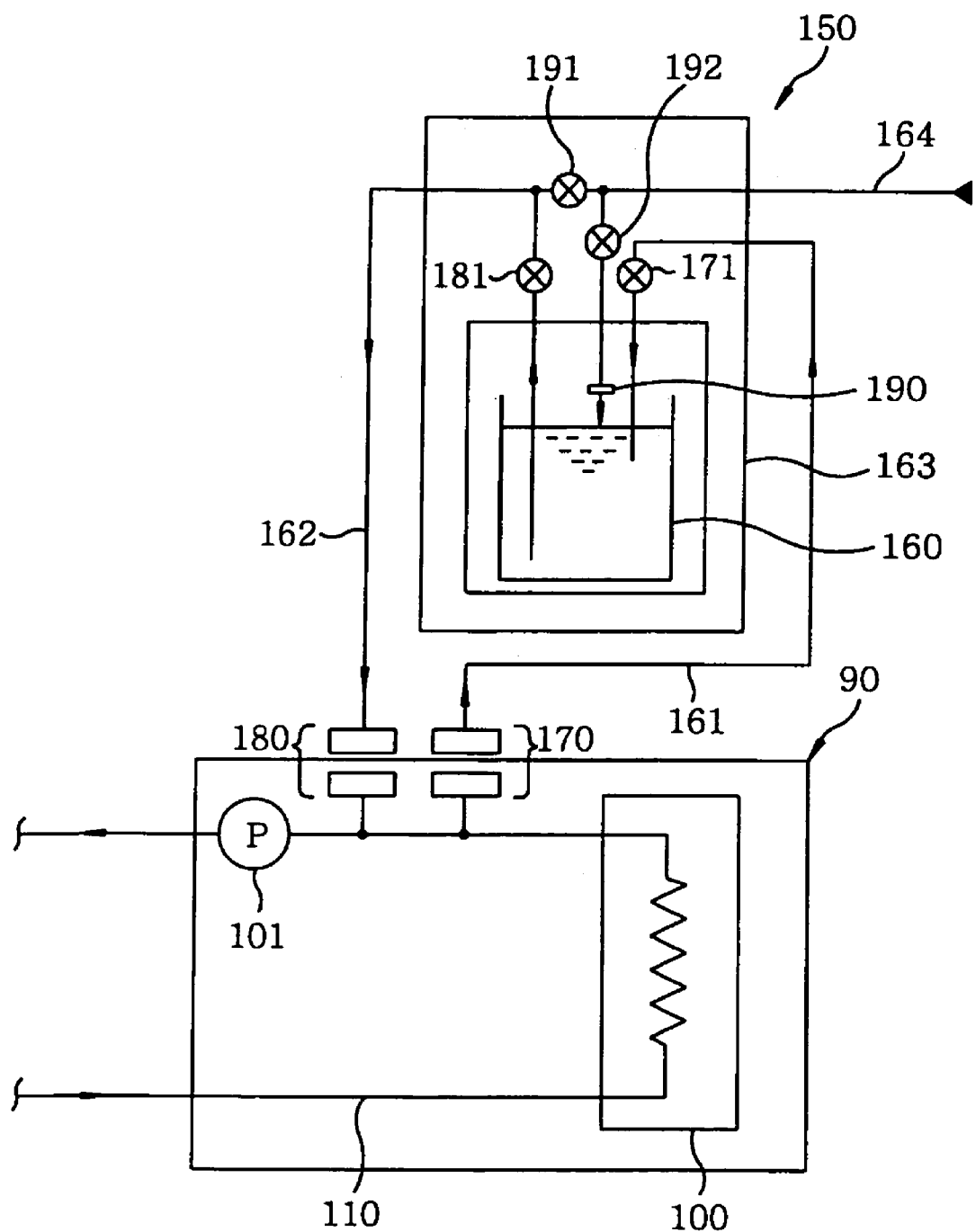
FIG. 3 is a schematic diagram showing a configuration of a brine collection device.

For example, as shown in FIG. 3, the brine collection device 150 mainly includes: a storage tank 160 for storing the brine; a first passageway 161 for introducing the brine in the circulation system 91 to the storage tank 160; a second passageway 162 for draining the brine in the storage tank 160 to the circulation system 91; a storage tank accommodating container 163 capable of accommodating the storage tank 160 in a sealed state; and a gas supply line 164 for supplying a gas such as a nitrogen gas or an air into the second passageway 162 and the storage tank accommodating container 163.

For example, the first passageway 161 can be coupled to the circulation system 91, for example, by a coupler 170 as a connecting member. The first passageway 161 can be coupled to, for example, the passageway 110 between the heat exchanger 100 and the pump 101 of the circulation system 91. The first passageway 161 is provided with a first opening/closing valve 171 to stop an introduction of the brine.

The second passageway 162 can be coupled to the circulation system 91, for example, by a coupler 180 serving as a connecting member. The second passageway 162 can be coupled to, for example, the passageway 110 between the heat exchanger 100 and the pump 101 at a downstream side of the first passageway 161. The second passageway 162 is provided with a second opening/closing valve 181 to stop a drain of the brine.

The gas supply line 164 has, for example, one end of an upstream side thereof connected to a gas supply source (not shown), and the other end of a downstream side thereof connected to the second passageway 162 and a nozzle 190 disposed in the storage tank accommodating container 163. The gas supply line 164 is provided with a third opening/closing valve 191 for controlling a gas supply to the second passageway 162 and a fourth opening/closing valve 192 for controlling a gas supply to the nozzle 190.

The brine collection device 150 is separated from the circulation system 91, e.g., in case a plasma processing is performed so that the temperature control of the upper electrode 20 or the susceptor 12 is performed in the plasma processing apparatus 1. And, the first passageway 161 and the second passageway 162 are connected to the circulation system 91, e.g., at the time of a maintenance of the circulation system 91. Further, in case the brine in the circulation system 91 is collected, the first opening/closing valve 171 and the third opening/closing valve 191 are opened while the second opening/closing valve 181 and the fourth opening/closing valve 192 are closed, e.g., in a state that the pump 101 of the circulation system 101 is in operation. And then, a gas is supplied to the second passageway 162 through the gas supply line 164 and then is introduced to the circulation system 91 through the second passageway 162. The brine in the circulation system 91 is introduced in the storage tank 160 through the first passageway 161 by a pressure of the introduced gas. Accordingly, the brine in the circulation system 91 is collected to the storage tank 160.

In case the brine in the storage tank 160 is returned into the circulation system 91 after the maintenance work of the circulation system 91 is over, the second opening/closing valve 181 and the fourth opening/closing valve 192 are opened while the first opening/closing valve 171 and the third opening/closing valve 191 are closed, e.g., in the state that the pump 101 is in operation. And then, a gas is supplied in the storage tank accommodating container 163 through the gas supply line 164 so that the brine in the storage tank 160 is introduced to the circulation system 91 through the second passageway 162 by a pressure of the gas. Subsequently, the brine in the storage tank 160 is returned into the circulation system 91. After that, the brine collection device 150 is separated from the circulation system 91.

In accordance with this example, the maintenance of the circulation system 91 is achieved simply. Further, because a permanent storage tank for the maintenance is not required, a size of the heat exchange unit 90 is reduced accordingly.

Figure 4:
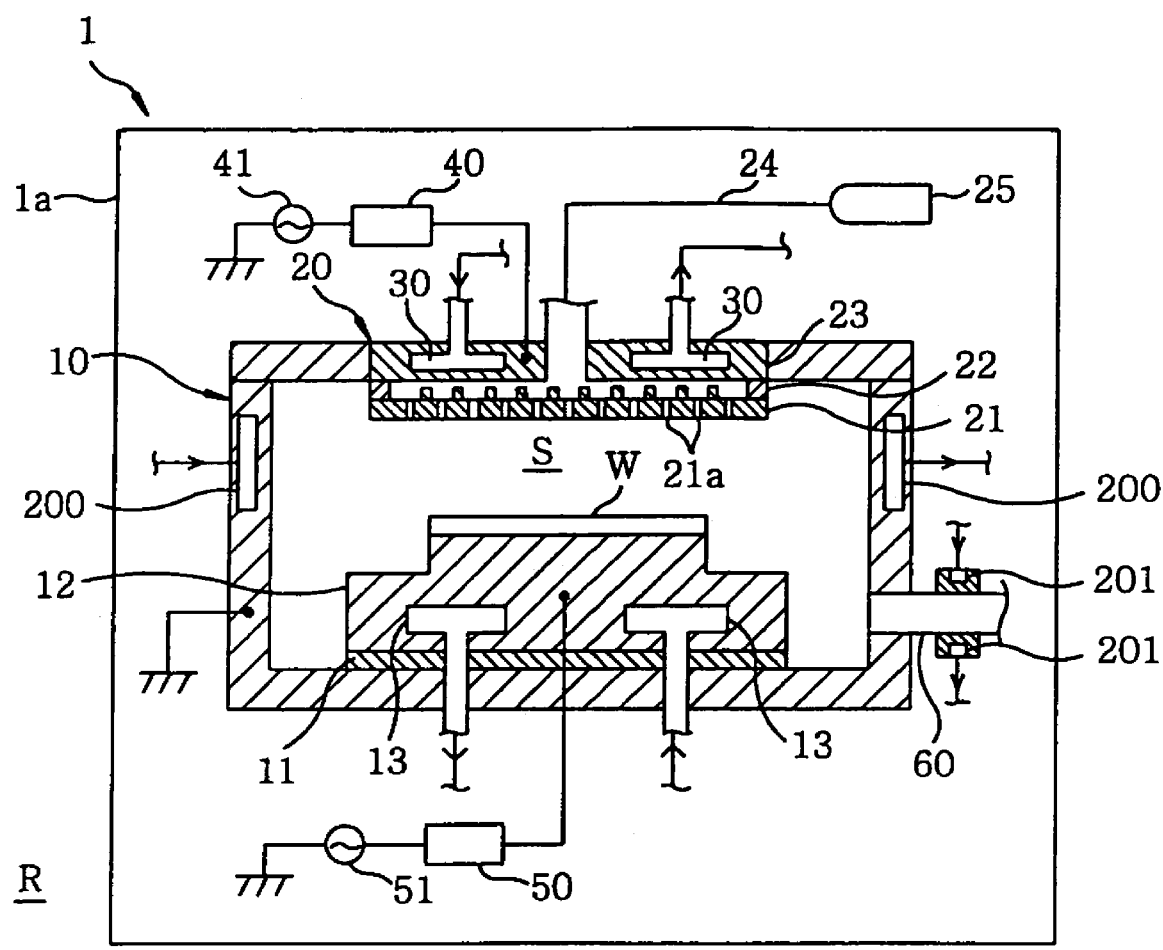
FIG. 4 depicts a longitudinal sectional view showing a case of controlling temperatures of a processing vessel and a gas exhaust pipe in the configuration of the plasma processing apparatus.
Figure 5:
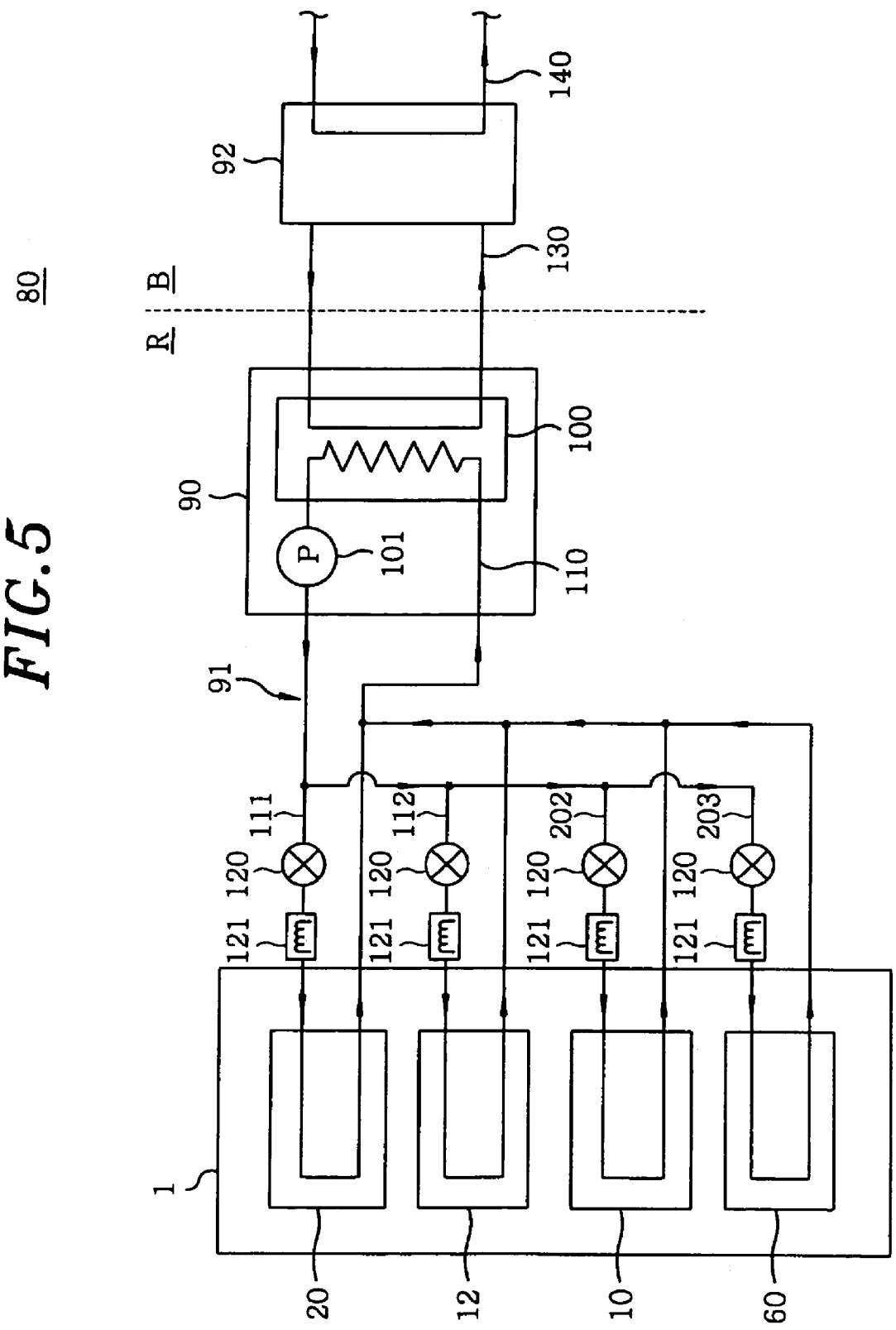
FIG. 5 presents a schematic diagram for showing the case of controlling the temperatures of the processing vessel and the gas exhaust pipe in the configuration of the temperature control system.

In the preferred embodiment described above, although it has been described that the temperature control system 80 controls the temperatures of the two members, i.e., the upper electrode 20 and the susceptor 12 of the plasma processing apparatus 1, it may be possible to control temperatures of three or more members including other members of the plasma processing apparatus 1. The temperature control system 80 may control temperature of, e.g., the processing vessel 10 or the gas exhaust pipe 60 of the plasma processing apparatus 1 in addition to that of the upper electrode 20 or the susceptor 12. In this case, for example, a plasma processing apparatus 1 shown in FIG. 4 includes a brine flow path 200 passing through an inside of the sidewall of the processing vessel 10 and the brine flow path 201 passing through an inside of the sidewall of the gas exhaust pipe 60. As shown in FIG. 5, the circulation system 91 of the temperature control system 80 is provided with a branch line 202 communicated with the processing vessel 10 from the passageway 110 and directed back to the passageway 110 through the flow path 200, and a branch line 203 communicated with the gas exhaust pipe 60 from the passageway 110 and directed back to the passageway 110 through the flow path 201. Each of the branch lines 202 and 203 is provided with the flow rate control valve 120 and the heater 121. Accordingly, the temperature of the processing vessel 10 or the gas exhaust pipe 60 as well as that of the upper electrode 20 or the susceptor 12 can also be controlled by the same heat exchanger 100.

The plasma processing apparatus 1 may include one or more additional members that are temperature controlled at relatively high temperatures, and the third coolant of the chiller 92 may be employed to cool down a brine.

Figure 6:
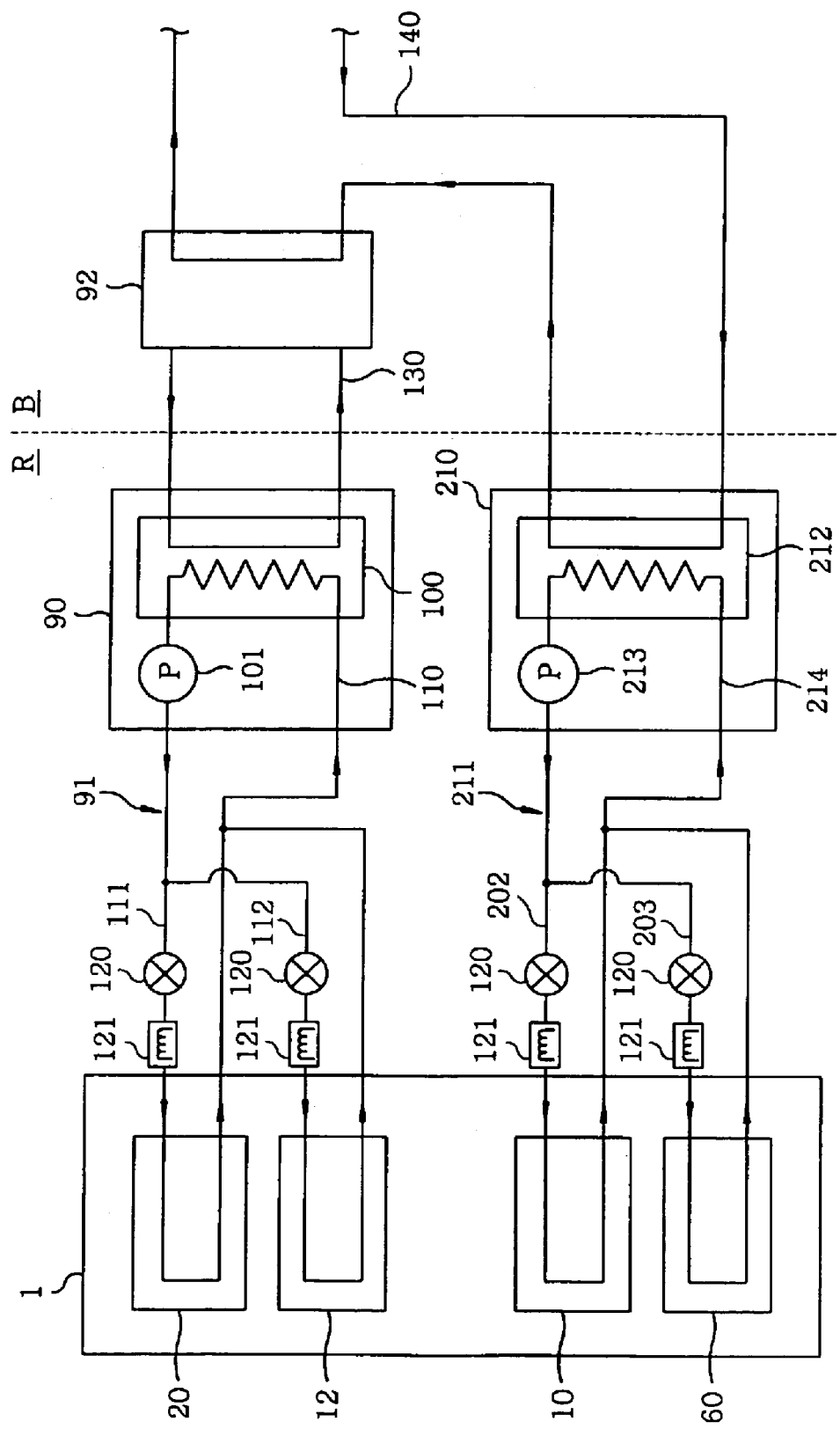
FIG. 6 is a schematic diagram showing a case of employing a third coolant used for cooling a brine in the configuration of the temperature control system.

In this case, as for members which are temperature controlled by a brine of relatively low temperature equal to or less than, e.g., 0° C., such as the upper electrode 20 and the susceptor 12, the brine therefor is cooled by the flon substitute supplied from the chiller 92 in the same manner as the aforementioned preferred embodiment. As shown in FIG. 6, an additional heat exchange unit 210 is provided for the additional members that are temperature controlled by a brine of relatively high temperature equal to or greater than, e.g., 0° C., such as the processing vessel 10 and the gas exhaust pipe 60. The heat exchange unit 210 is installed in the clean room R. Connected to the additional heat exchange unit 210 is an additional circulation system 211 for circulating the brine between the processing vessel 10 and the gas exhaust pipe 60 as similar as in the heat exchange unit 90. Further, the additional heat exchange unit 210 includes an additional heat exchanger 212 and a pump 213. The additional circulation system 211 includes a passageway 214, passing through the additional heat exchange unit 210, wherein the passageway 214 has the above branch line 202 passing through the processing vessel 10, and the above branch line 203 passing through the gas exhaust pipe 60 connected thereto. As describe above, each of the branch lines 202 and 203 is provided with the flow rate control valve 120 and the heater 121. The third coolant circulation path 140 supplies the cooling water to the additional heat exchanger 212, and in turn, to the chiller 92. Accordingly, the brine for controlling the temperatures of the processing vessel 10 and the gas exhaust pipe 60 is cooled in the additional heat exchanger 212 by the third coolant of the chiller 92.

In this case, if there are many members to be temperature-controlled, because a brine of a high temperature can be circulated for the members which are temperature controlled at relatively high temperatures, it can be achieved to perform an accurate temperature control of the brine in the respective branch lines 202 and 203 by the heater 121 within a short time.

While the preferred embodiments of the present invention have been shown and described in conjunction with the accompanying drawings, the present invention is not limited thereto. It will be understood by those skilled in the art that various changes and modifications may be made without departing from the scope of the invention as defined in the following claims, and they are embraced in the technical scope of the present invention. Accordingly, the present invention may take various forms other than the specific embodiments as illustrated herein. For example, although the preferred embodiments have described the case the substrate processing apparatus having the members whose temperatures are controlled, is the plasma processing apparatus for performing the etching process, the present invention can be applied to a plasma processing apparatus for performing a film forming process or the like. Further, even if the plasma is not used, the present invention can be applied to other substrate processing apparatuses.

What is claimed is:

1. A temperature control system that controls temperatures of a plurality of members of a substrate processing apparatus, comprising:
   a circulation system that accommodates a first coolant to pass through the inside of each of at least a part of the members;
   a heat exchange unit consisting essentially of a heat exchanger that performs heat exchange between the first coolant of the circulation system and a second coolant and a pump that circulates the first coolant in the circulation system; and
   a chiller that supplies the second coolant to the heat exchanger,
   wherein the circulation system includes one or more branch lines for each of said at least the part of the members passing through the inside thereof,
   wherein each of the branch lines is provided with a heating member that heats the first coolant supplied thereto,
   wherein the heat exchanger is installed in a room where the substrate processing apparatus is installed,
   wherein the temperature control system is configured to control temperatures of said at least the part of the members to be different from each other by using the heating member,
   wherein the heating member is provided on an inlet side of each of said at least the part of the members,
   wherein a flow rate control valve is installed at each of the branch lines, on an inlet side of the heating member, and
   wherein the first coolant is cooled in the heat exchanger to a temperature below target temperatures of said at least the part of the members and heated by the heating member to a respective target temperature.

2. The temperature control system of claim 1, wherein the room is a clean room.

3. The temperature control system of claim 1, wherein the circulation system is devoid of a storage tank of the first coolant.

4. The temperature control system of claim 1, further comprising:
   a first coolant collection device that collects therein the first coolant of the circulation system and returns the collected first coolant to the circulation system,
   wherein the first coolant collection device is detachable from the circulation system.

5. The temperature control system of claim 4, wherein the first coolant collection device includes:
   a storage tank that stores the first coolant;
   a first passageway that introduces the first coolant of the circulation system to the storage tank;
   a second passageway that drains the first coolant from the storage tank to the circulation system; and
   a gas supply line that supplies a gas into the second passageway.

6. The temperature control system of claim 5, wherein the storage tank is accommodated in an airtight storage tank accommodating container, and
   the gas supply line is configured to supply the gas into the storage tank accommodating container.

7. The temperature control system of claim 1, the temperature control system further comprising:
   an additional circulation system that circulates a coolant medium to pass through the inside of each of another part of the members; and
   an additional heat exchanger that performs heat exchange between the coolant medium and a third coolant which serves to cool the second coolant at the chiller.

8. The temperature control system of claim 7, wherein the first coolant and the coolant medium of the circulation systems are made of an identical material.

9. A substrate processing apparatus, comprising:
   a plurality of members; and
   a temperature control system including a circulation system that accommodates a first coolant to pass through the inside of each of at least a part of the members, a heat exchange unit consisting essentially of a heat exchanger that performs heat exchange between the first coolant of the circulation system and a second coolant and a pump that circulates the first coolant in the circulation system, and a chiller that supplies the second coolant to the heat exchanger,
   wherein the circulation system includes one or more branch lines for each of said at least the part of the members passing through the inside thereof,
   wherein each of the branch lines is provided with a heating member that heats the first coolant supplied thereto,
   wherein the heat exchanger is installed in a room where the substrate processing apparatus is installed,
   wherein the temperature control system is configured to control temperatures of said at least the part of the members to be different from each other by using the heating member,
   wherein the heating member is provided on an inlet side of each of said at least the part of the members,
   wherein a flow rate control valve is installed at each of the branch lines, and
   wherein the first coolant is cooled in the heat exchanger to a temperature below target temperatures of said at least the part of the members.

* * * * *